(12) United States Patent
Goto et al.

(10) Patent No.: US 12,072,377 B2
(45) Date of Patent: Aug. 27, 2024

(54) INFORMATION PROCESSING APPARATUS, INFORMATION PROCESSING METHOD, AND STORAGE MEDIUM

(71) Applicant: KABUSHIKI KAISHA TOSHIBA, Tokyo (JP)

(72) Inventors: Kiichi Goto, Kawasaki Kanagawa (JP); Yasutoyo Takeyama, Kawasaki Kanagawa (JP); Yoshiyuki Kokojima, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 18/174,230

(22) Filed: Feb. 24, 2023

(65) Prior Publication Data

US 2024/0036110 A1  Feb. 1, 2024

(30) Foreign Application Priority Data

Jul. 28, 2022  (JP) ................. 2022-120212

(51) Int. Cl.
*G01R 31/317* (2006.01)
(52) U.S. Cl.
CPC .............. *G01R 31/31704* (2013.01)
(58) Field of Classification Search
None
See application file for complete search history.

(56) References Cited

U.S. PATENT DOCUMENTS

| 9,503,467 B2 * | 11/2016 | Lefebvre | H04W 12/08 |
| 10,902,062 B1 * | 1/2021 | Guha | G06F 16/9027 |
| 2021/0390027 A1 * | 12/2021 | Ohana | G06F 11/3055 |
| 2022/0086050 A1 * | 3/2022 | Goloubev | H04L 41/145 |
| 2022/0129764 A1 * | 4/2022 | Ikeda | G06N 5/01 |
| 2022/0191226 A1 * | 6/2022 | Chan | G06F 16/9024 |
| 2022/0350789 A1 * | 11/2022 | Yang | G06F 16/2365 |
| 2022/0407879 A1 * | 12/2022 | Dong | H04L 63/1475 |
| 2023/0063614 A1 * | 3/2023 | Lee | G06Q 10/0637 |

(Continued)

OTHER PUBLICATIONS

X. Ma et al., "A Comprehensive Survey on Graph Anomaly Detection With Deep Learning," in IEEE Transactions on Knowledge and Data Engineering, vol. 35, No. 12, pp. 12012-12038, Oct. 8, 2021 (Year: 2021).*

(Continued)

*Primary Examiner* — Daniel F. McMahon
(74) *Attorney, Agent, or Firm* — Finnegan, Henderson, Farabow, Garrett & Dunner, LLP

(57) ABSTRACT

An information processing apparatus includes a processor including hardware. The processor extracts neighboring nodes in two or more different extraction ranges for each node constituting input data of a graph structure. The processor calculates an anomaly score representing a degree of anomaly of the node for each extraction range based on a representation of a combination of the node and the neighboring nodes. The processor records each calculated anomaly score in a storage. The processor selects a maximum anomaly score among the anomaly scores recorded in the storage. The processor determines an anomaly node in the input data of the graph structure based on the selected maximum anomaly score. The processor outputs information of the anomaly node.

7 Claims, 8 Drawing Sheets

(56) References Cited

U.S. PATENT DOCUMENTS

2023/0089481 A1* 3/2023 Liu .................... G06N 3/0455
                                                              706/15
2023/0353584 A1* 11/2023 Liu .................... H04L 63/1416

OTHER PUBLICATIONS

Thomas N. Kipf et al., "Semi-Supervised Classification with Graph Convolutional Networks," Proc. of the 2017 Int'l Conf. on Learning Representations, 14 pages (2017).
Yen-Chang HSU et al., "Generalized ODIN: Detecting Out-of-distribution Image without Learning from Out-of-distribution Data.", Proc. of the 2020 IEEE/CVF Conf. on Computer Vision and Pattern Recognition, pp. 10951-10960 (2020).
Yasutoyo Takayama et al., U.S. App. U.S. Appl. No. 17/942,252, filed Sep. 12, 2022.
Yanquiao Zhu, et al., "Graph Contrastive Learning with Adaptive Augmentation," arXiv:2010.14945v3, https://doi.org/10.1145/3442381.3449802, 12 pages (2021).

* cited by examiner

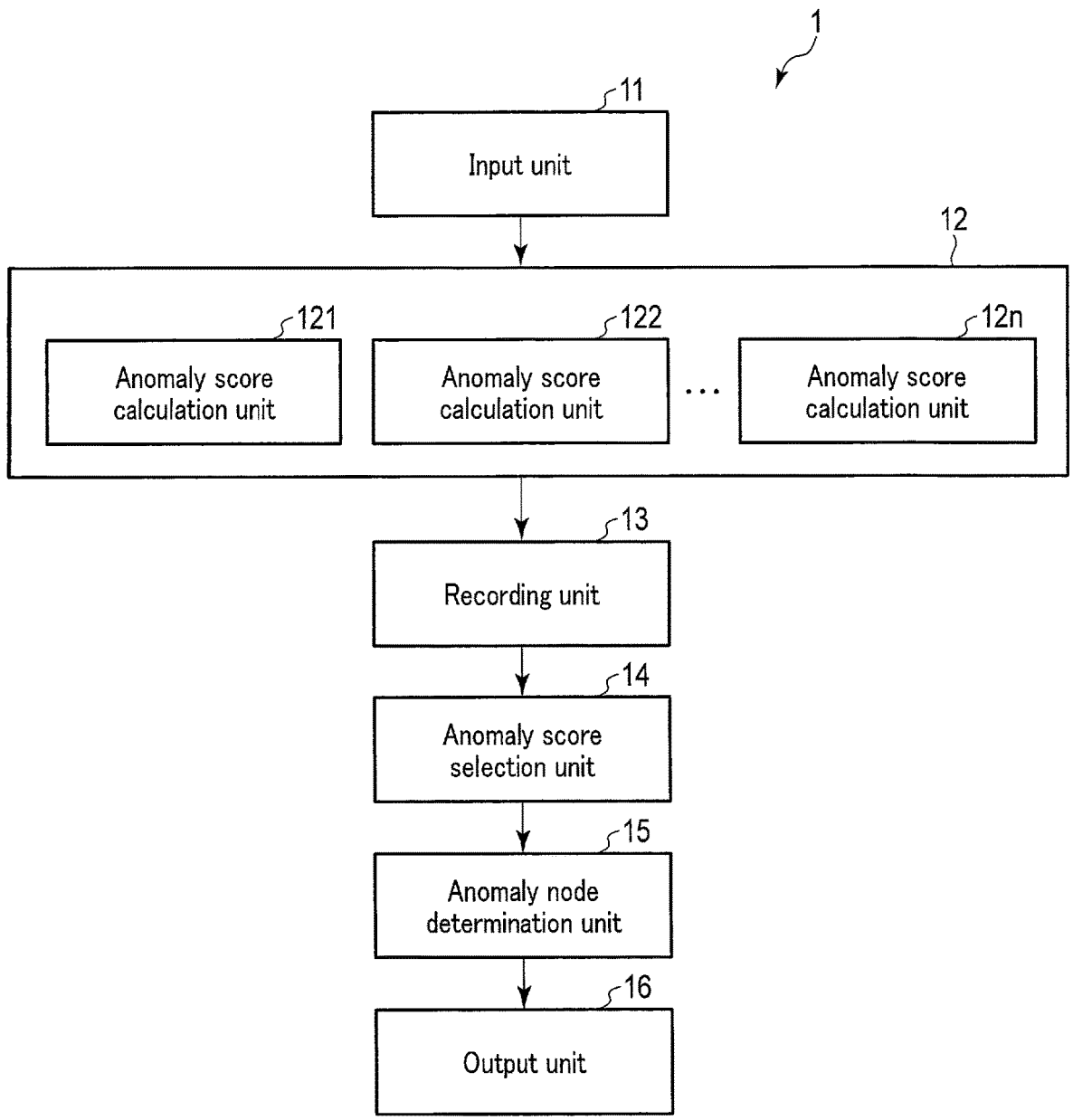
F I G. 1

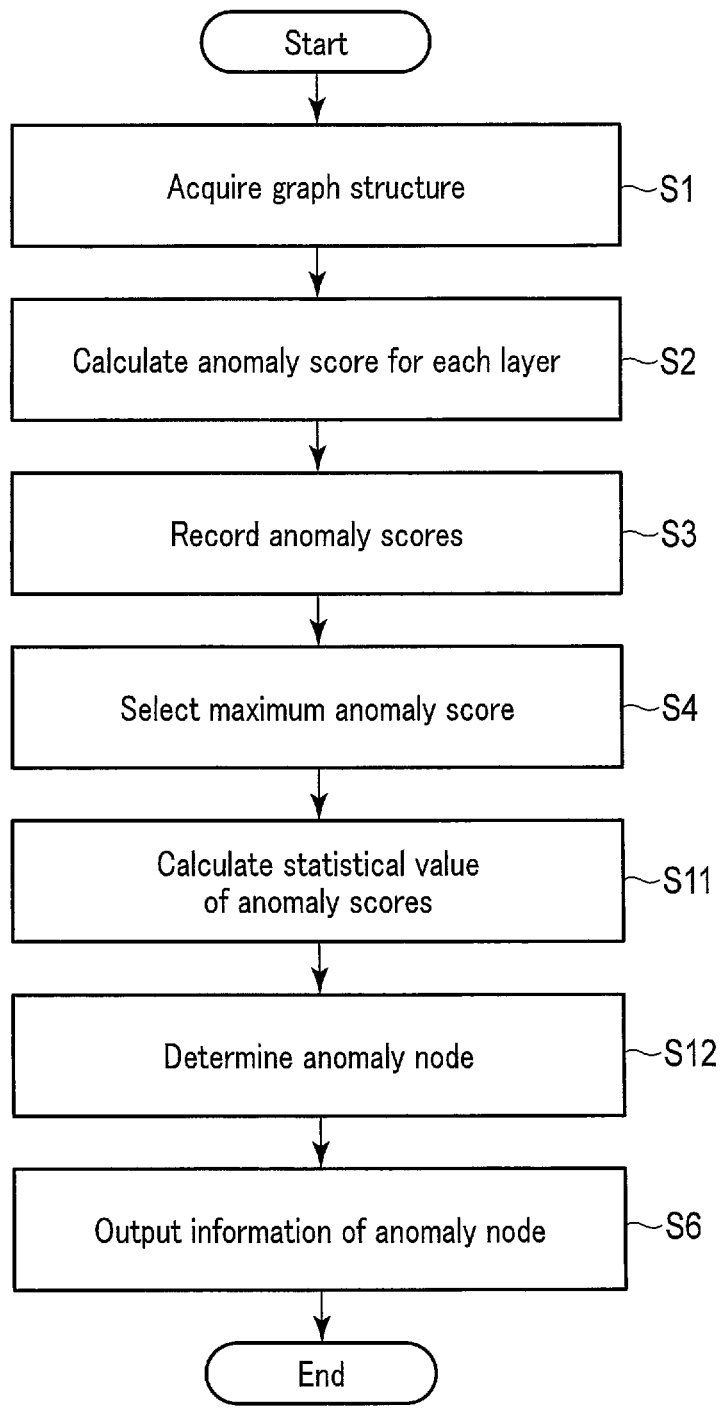
F I G. 8

INFORMATION PROCESSING APPARATUS, INFORMATION PROCESSING METHOD, AND STORAGE MEDIUM

CROSS-REFERENCE TO RELATED APPLICATIONS

This application is based upon and claims the benefit of priority from the Japanese Patent Application No. 2022-120212, filed Jul. 28, 2022, the entire contents of which are incorporated herein by reference.

FIELD

Embodiments described herein relate generally to an information processing apparatus, an information processing method, and a storage medium.

BACKGROUND

A design drawing of an electric circuit can be converted into a graph structure by regarding circuit parts as nodes and wirings between the circuit parts as edges. In addition, the inspection of the design drawing is considered as graph anomaly detection by considering, as an anomaly, the design drawing in which a design error has occurred. Causes of the design error include an error of a parameter of a circuit part and an error of a combination of circuit parts including a peripheral structure. There are various kinds of parameters of circuit parts, and there are various ranges of peripheral structures. Therefore, there are various causes of design errors.

A graph convolutional network (GCN), which is one of recent graph analysis techniques, extracts representations of nodes with peripheral structures by convoluting a neighboring node close to each of the nodes. The GCN has a property of being able to convolve information of higher-order proximity in a wider range by overlapping layers. Most technologies using the GCN use one network for all nodes. Therefore, in a shallow layered network, peripheral structures spanning a wide range cannot be convolved. In addition, in a deep layered network, a peripheral structure in a small range is buried. Thus, the conventional technology using the GCN cannot cope with various peripheral structures.

BRIEF DESCRIPTION OF THE DRAWINGS

FIG. 1 is a block diagram illustrating a configuration of an information processing apparatus according to a first embodiment.

FIG. 8 is a flowchart illustrating an information processing method by the information processing apparatus according to the third embodiment.

DETAILED DESCRIPTION

Figure 2:
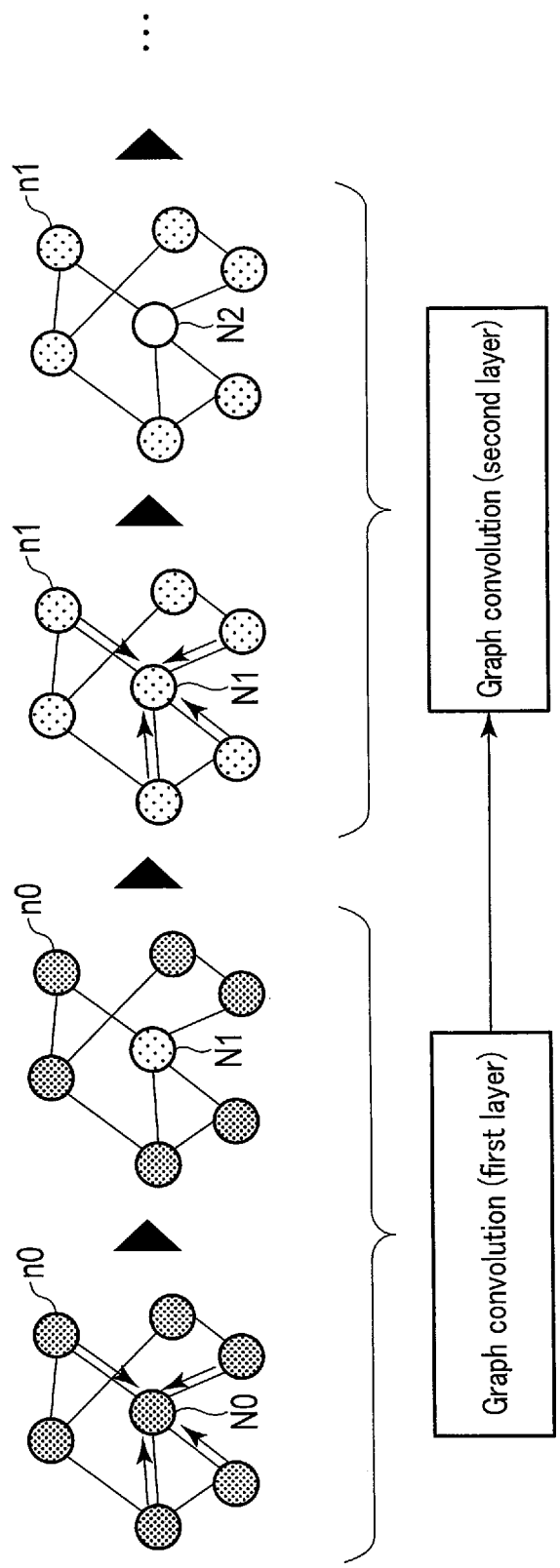
FIG. 2 is a diagram illustrating the concept of a GCN.

In general, according to one embodiment, an information processing apparatus includes a processor including hardware. The processor extracts neighboring nodes in two or more different extraction ranges for each node constituting input data of a graph structure. The processor calculates an anomaly score representing a degree of anomaly of the node for each extraction range based on a representation of a combination of the node and the neighboring nodes. The processor records each calculated anomaly score in a storage. The processor selects a maximum anomaly score among the anomaly scores recorded in the storage. The processor determines an anomaly node in the input data of the graph structure based on the selected maximum anomaly score. The processor outputs information of the anomaly node.

Hereinafter, embodiments will be described with reference to the drawings.

First Embodiment

First, a first embodiment will be described. FIG. 1 is a block diagram illustrating a configuration of an information processing apparatus according to the first embodiment. The information processing apparatus 1 includes an input unit 11, an anomaly score calculation unit 12, a recording unit 13, an anomaly score selection unit 14, an anomaly node determination unit 15, and an output unit 16.

The input unit 11 receives input of data of a graph structure. The graph structure is a combination of nodes and edges representing a relationship between a plurality of things. Each node is a vertex in a graph structure. Each edge is a side connecting nodes.

Here, each node may have attribute information such as a label, a category, and a parameter as an initial value. In addition, each node may have information of the degree in graph theory, that is, information of the number of edges connected to the node. Furthermore, the attribute information or the like of each node may be quantified with an embedding vector obtained by Deepwalk and node2vec, or the like. Furthermore, each edge may have direction information and/or weight information.

In addition, the data of the graph structure input to the input unit 11 may be any graphed data such as graphed data of a chemical molecular structure, graphed data of a citation relationship of a paper, graphed data of a co-selling relationship of a product, graphed data of a relationship of a user in a social network, graphed data of a design drawing of an electric circuit, graphed data of a source code of a program, and a plurality of pieces of graphed sensor data. For example, in the case of data of a chemical molecular structure, a node represents each atom constituting a molecule, and an edge represents a bond between atoms. In the case of data of a citation relationship of a paper, a node represents each paper, and an edge represents a relationship between a citation in the paper and a cited paper. In the case of data of a co-selling relationship of a product, a node represents each product, and an edge represents that products coupled to each other by the edge are co-sold. In the case of data of a relationship of a user in a social network, a node represents each user, and an edge represents a relationship between users. In the case of data of a design drawing of an electric circuit, a node represents each circuit part, and an edge represents a wiring. In the case of data of a source code of a program, a node represents a unit of each processing, and an edge represents a transition of processing. In the case of a plurality of sensor data, a node represents each sensor, and an edge represents a relationship between sensors.

The anomaly score calculation unit 12 calculates anomaly scores from the relationship between the nodes in the input data of the graph structure. The anomaly scores represent degrees of anomaly of the nodes. In the embodiment, the anomaly score calculation unit 12 includes at least two or more anomaly score calculation units 121, 122, . . . , and 12$n$ (n is an integer of 2 or more) having different extraction ranges of neighboring nodes extracted for calculation of the anomaly scores. Each of the anomaly score calculation units 121, 122, . . . , and 12$n$ extracts representations of combinations of the nodes and neighboring nodes close to the nodes constituting the data of the graph structure, and calculates anomaly scores based on the extracted representations of the nodes.

The representations are extracted using, for example, a GCN. The GCN is a neural network having a function of convolving a neighboring node of each node. FIG. 2 is a diagram illustrating the concept of the GCN. The GCN has one or more graph convolution layers. Then, the extraction ranges of the neighboring nodes vary depending on the total number of graph convolution layers.

For example, in a case where the data of the graph structure as illustrated in FIG. 2 is input to the first graph convolution layer, attention is paid to one node N0. Four nodes n0 are close to the node N0. The first graph convolution layer updates the node N0 to a node N1 by convolving the four nodes n0 to the node N0. The node N1 has information of the node N0 and the nodes n0. A similar convolution process is performed for each node of the input data of the graph structure. As a result, the nodes n0 are also updated by convolving neighboring nodes close to the nodes n0.

As illustrated in FIG. 2, when the GCN has two or more graph convolution layers, the data of the graph structure constituted by the nodes convolved by a previous graph convolution layer is input to the next graph convolution layer. For example, in FIG. 2, the data of the graph structure constituted by the nodes convolved by the first graph convolution layer is input to the second graph convolution layer. Here, attention is focused on the node N1 corresponding to the node N0. Four nodes n1 are close to the node N1. As described above, the node N1 is the node N0 updated by convolving the neighboring nodes n0. Similarly, the nodes n1 are nodes updated by convolving neighboring nodes close to the nodes n1. The second graph convolution layer updates information of the node N1 to a node N2 by convolving the four nodes n1 to the node N1. The node N2 has information of the node N1 and the nodes n1. That is, the node N2 also has information of the neighboring nodes close to the node N0 and the neighboring nodes close to the nodes n0. A similar convolution process is performed for each node of the input data of the graph structure. As a result, the nodes n1 are also updated by convolving neighboring nodes close to the nodes n1.

Such a convolution process is repeated up to the n-th graph convolution layer. Then, the representation of each node is extracted from the data of the graph structure output from the n-th graph convolution layer.

As described above, the number of layers of the GCN corresponds to the extraction range of neighboring nodes that can be convolved. That is, a GCN with a large number of graph convolution layers can convolve neighboring nodes in a wide extraction range of the graph structure into a single node. On the other hand, in a GCN having a large number of graph convolution layers, structural features of neighboring nodes in a narrow extraction range of the graph structure tend to be buried.

Therefore, in the embodiment, the anomaly score calculation units 121, 122, . . . , and 12$n$ include GCNs having different numbers of layers so as to be able to extract representations of respective nodes with peripheral structures in different extraction ranges. For example, the anomaly score calculation unit 121 includes a GCN with one layer, the anomaly score calculation unit 122 includes a GCN with two layers, and the anomaly score calculation unit 12$n$ includes a GCN with n layers. Here, the numbers of GCN layers included in the anomaly score calculation units are not necessarily consecutive. For example, the anomaly score calculation unit 121 may include a GCN with one layer, and the anomaly score calculation unit 122 may include a GCN with three layers.

Further, each of the anomaly score calculation units 121, 122, . . . , and 12$n$ calculates anomaly scores using the representation of each node extracted using the GCNs. The anomaly scores calculated by each of the anomaly score calculation units 121, 122, . . . , and 12$n$ represent a distribution of the anomaly scores of the nodes extracted using the GCNs. The anomaly scores are normalized to, for example, a range of 0 to 1. The larger the values of the anomaly scores, the higher the anomaly scores. For example, the framework of Generalized ODIN can be used to calculate the anomaly scores.

As described above, since the GCNs having the different numbers of layers are provided, the anomaly score calculation unit 12 can calculate an anomaly score of a combination of each of all the nodes finally included in the data of the graph structure and peripheral structures in at least two or more extraction ranges for each of the nodes.

Here, learning of the GCNs and Generalized ODIN in the anomaly score calculation units 121, 122, . . . , and 12$n$ can be individually performed. That is, each of the anomaly score calculation units 121, 122, . . . , and 12$n$ individually includes a learning unit. Each learning unit optimizes a network parameter such that the performance of anomaly detection is maximized for each GCN. Here, it is desirable that data of a graph structure including only normal nodes not including an anomaly node be used for learning in the learning units.

The recording unit 13 records the anomaly scores obtained by each of the anomaly score calculation units 121, 122, . . . , and 12$n$ of the anomaly score calculation unit 12 in association with information of the extraction ranges of the neighboring nodes extracted by each of the anomaly score calculation units 121, 122, . . . , and 12$n$.

The anomaly score selection unit 14 refers to the anomaly scores calculated by each of the anomaly score calculation units 121, 122, . . . , and 12$n$ of the anomaly score calculation unit 12, and selects the maximum anomaly score among the anomaly scores and an extraction range corresponding to the maximum anomaly score. This is based on the premise that a normal node always has a low anomaly score and that an extraction range having the highest anomaly score is suitable for anomaly detection.

The anomaly node determination unit 15 determines an anomaly node in the extraction range using the anomaly score selected by the anomaly score selection unit 14. For example, the anomaly node determination unit 15 creates a distribution of anomaly scores of all nodes within the extraction range, compares the anomaly score of each node with a threshold, and determines a node having an anomaly score equal to or greater than the threshold as an anomaly node. The threshold for the anomaly scores may be a predetermined fixed value, an average value of the anomaly scores of all the nodes in the extraction range, or the like.

The output unit 16 outputs information of the anomaly node determined by the anomaly node determination unit 15. For example, the output unit 16 displays the graph structure input to the input unit 11 on a display device, and displays and highlights the anomaly node on the graph structure. The highlighting may be performed by various methods such as coloring the corresponding node, changing the shape of the corresponding node, and changing the size of the corresponding node. In addition, the output unit 16 may display an extraction range of neighboring nodes used for calculating the anomaly scores. The display indicating the extraction range of the neighboring nodes may be performed by various methods such as enclosing the corresponding nodes. Furthermore, the output unit 16 may display an anomaly score. The displayed anomaly score may be a maximum anomaly score within the extraction range, an average value of the anomaly scores, or the like. Furthermore, the output unit 16 may output information of the anomaly node by a method not depending on display, for example, by printing.

Figure 3:
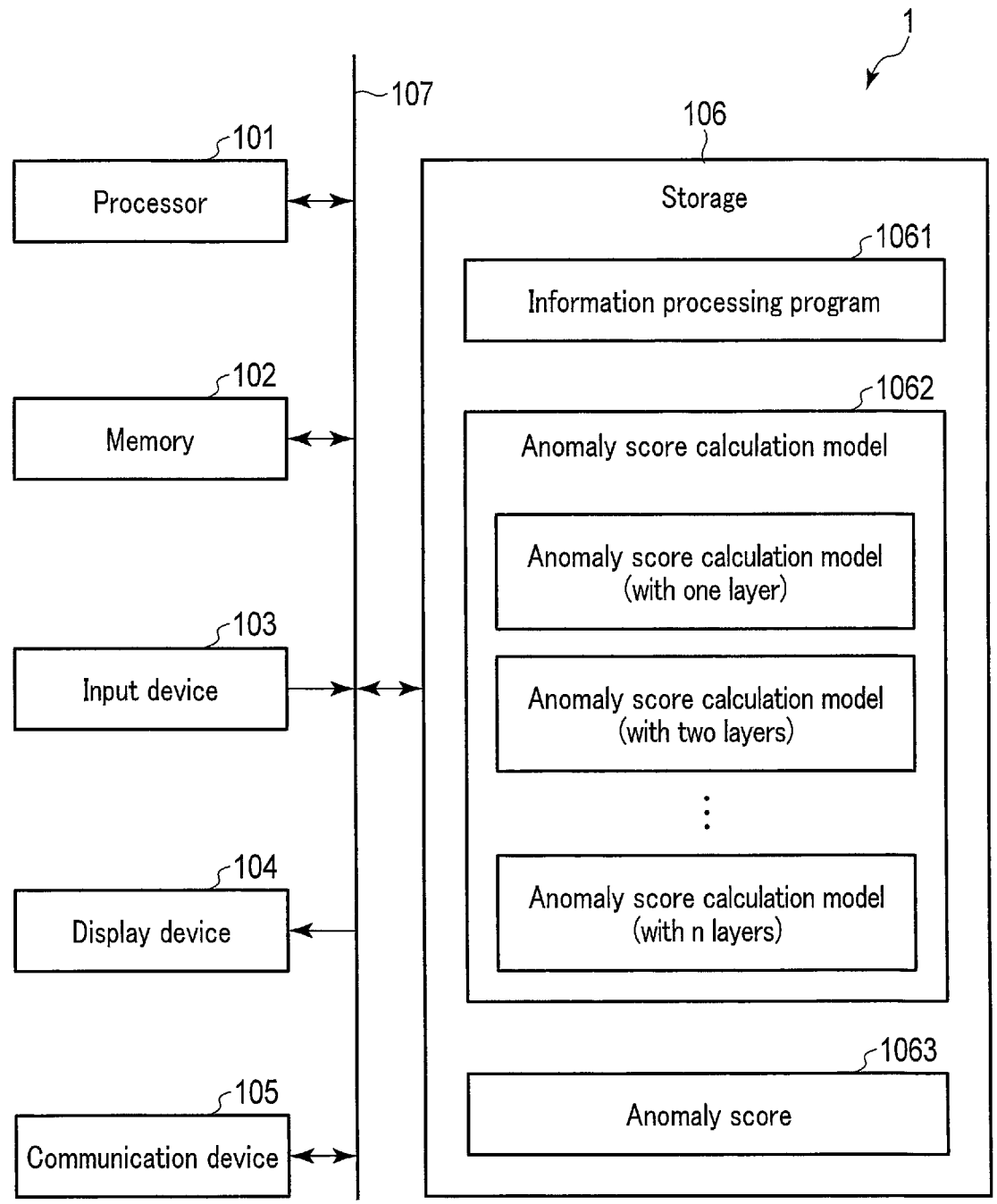
FIG. 3 is a diagram illustrating an example of a hardware configuration of the information processing apparatus.

FIG. 3 is a diagram illustrating an example of a hardware configuration of the information processing apparatus 1. The information processing apparatus 1 includes, for example, a processor 101, a memory 102, an input device 103, a display device 104, a communication device 105, and a storage 106 as hardware. The processor 101, the memory 102, the input device 103, the display device 104, the communication device 105, and the storage 106 are connected to a bus 107. The information processing apparatus 1 may be a terminal device such as a personal computer (PC), a smartphone, or a tablet terminal. However, the information processing apparatus 1 may be incorporated in an arbitrary apparatus. Furthermore, the information processing apparatus 1 may not include all of the components illustrated in FIG. 3. For example, the information processing apparatus 1 may not include the display device 104 and the communication device 105.

The processor 101 controls the overall operation of the information processing apparatus 1. The processor 101 operates as the input unit 11, the anomaly score calculation unit 12, the anomaly score selection unit 14, the anomaly node determination unit 15, and the output unit 16, for example, by executing a program stored in the storage 106. The processor 101 is, for example, a CPU. The processor 101 may be an MPU, a GPU, an ASIC, an FPGA, or the like. The processor 101 may be a single CPU or the like, or may be a plurality of CPUs or the like.

The memory 102 includes a ROM and a RAM. The ROM is a nonvolatile memory. The ROM stores a startup program and the like of the information processing apparatus 1. The RAM is a volatile memory. The RAM is used as a working memory at the time of processing in the processor 101, for example.

The input device 103 is a touch panel, a keyboard, or a mouse. When the input device 103 is operated, a signal corresponding to the operation content is input to the processor 101 via the bus 107. The processor 101 performs various types of processing according to this signal. The input device 103 can be used to input data of a graph structure, for example.

The display device 104 is a liquid crystal display or an organic EL display. The display device 104 displays various images. The display device 104 displays, for example, information of an anomaly node.

The communication device 105 is provided for the information processing apparatus 1 to communicate with an external device. The communication device 105 may be provided for wired communication or for wireless communication.

The storage 106 is, for example, a hard disk drive or a solid state drive. The storage 106 stores an information processing program 1061 to be executed by the processor 101. In addition, the storage 106 may store an anomaly score calculation model 1062. The anomaly score calculation model 1062 corresponds to the anomaly score calculation unit 12, and extracts representations of nodes with peripheral structures in different extraction ranges and calculates anomaly scores based on the extracted representations of the nodes. The anomaly score calculation model 1062 includes GCNs having different numbers of layers, and includes a plurality of anomaly score calculation models corresponding to the anomaly score calculation units 121, 122, ..., and 12n. The anomaly score calculation model 1062 does not necessarily need to be stored in the storage 106. For example, the anomaly score calculation model 1062 may be stored in an external storage outside the information processing apparatus 1. In this case, the information processing apparatus 1 acquires necessary information by accessing the external storage using the communication device 105.

In addition, an anomaly score 1063 can be recorded in the storage 106. The anomaly score 1063 is calculated by each of the plurality of anomaly score calculation models including the GCNs having the different numbers of layers. The anomaly score 1063 is associated with information of extraction ranges of neighboring nodes extracted by each anomaly score calculation model.

The bus 107 is a data transfer path for exchanging data between the processor 101, the memory 102, the input device 103, the display device 104, the communication device 105, and the storage 106.

Figure 4:
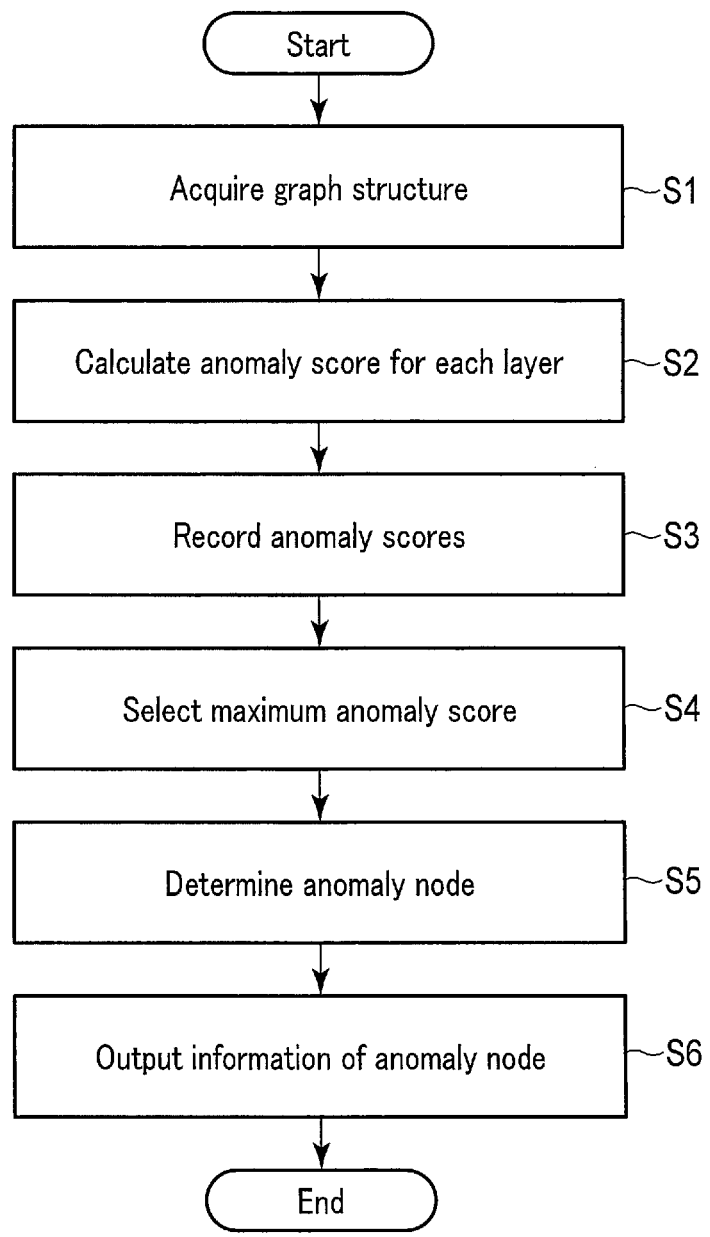
FIG. 4 is a flowchart illustrating an information processing method by the information processing apparatus according to the first embodiment.

Next, the operation of the information processing apparatus 1 will be described. FIG. 4 is a flowchart illustrating an information processing method by the information processing apparatus 1 according to the first embodiment. A process illustrated in FIG. 4 is performed by the processor 101.

In step S1, the processor 101 acquires data of a graph structure. As described above, the data of the graph structure may be input by a user. For example, the user operates the input device 103 to input the data of the graph structure.

In step S2, the processor 101 calculates the anomaly score of each layer by inputting the acquired data of the graph structure to each of the plurality of anomaly score calculation models including the GCNs having the different numbers of layers of the anomaly score calculation model 1062.

In step S3, the processor 101 records the anomaly score calculated for each layer in the anomaly score calculation model 1062 in the storage 106 in association with information of extraction ranges of neighboring nodes extracted by each anomaly score calculation model.

In step S4, the processor 101 selects the maximum anomaly score among the anomaly scores recorded in the storage 106 and an extraction range of a neighboring node corresponding to the maximum anomaly score. As described above, this is based on the premise that a normal node always has a low anomaly score and that an extraction range having the highest anomaly score is suitable for anomaly detection.

In step S5, the processor 101 determines an anomaly node based on the selected extraction range of the neighboring node. For example, the processor 101 determines the anomaly node by creating a distribution of the anomaly scores of the nodes in the extraction ranges and comparing the anomaly scores of the nodes with a threshold.

In step S6, the processor 101 outputs information of the anomaly node. Thereafter, the process illustrated in FIG. 4 ends. As the output of the information of the anomaly node, for example, the processor 101 displays the input graph structure on the display device, and displays and highlights the anomaly node on the graph structure.

As described above, according to the first embodiment, the information processing apparatus includes two or more anomaly score calculation units having different extraction ranges of neighboring nodes for each node. Then, an anomaly node is determined based on anomaly scores calculated by two or more anomaly score calculation units having different extraction ranges of neighboring nodes. As a result, the information processing apparatus according to the embodiment can cope with anomaly detection for data of a graph structure having various peripheral structures.

For example, the highest anomaly score among the anomaly scores calculated by two or more anomaly score calculation units having different extraction ranges and the extraction range of neighboring nodes corresponding to the anomaly score are selected. The extraction range having the highest anomaly score indicates that the detection capability of the anomaly score is the highest. Therefore, determination of an anomaly node is performed only within this extraction range, whereby an anomaly node can be appropriately determined.

Second Embodiment

Figure 5:
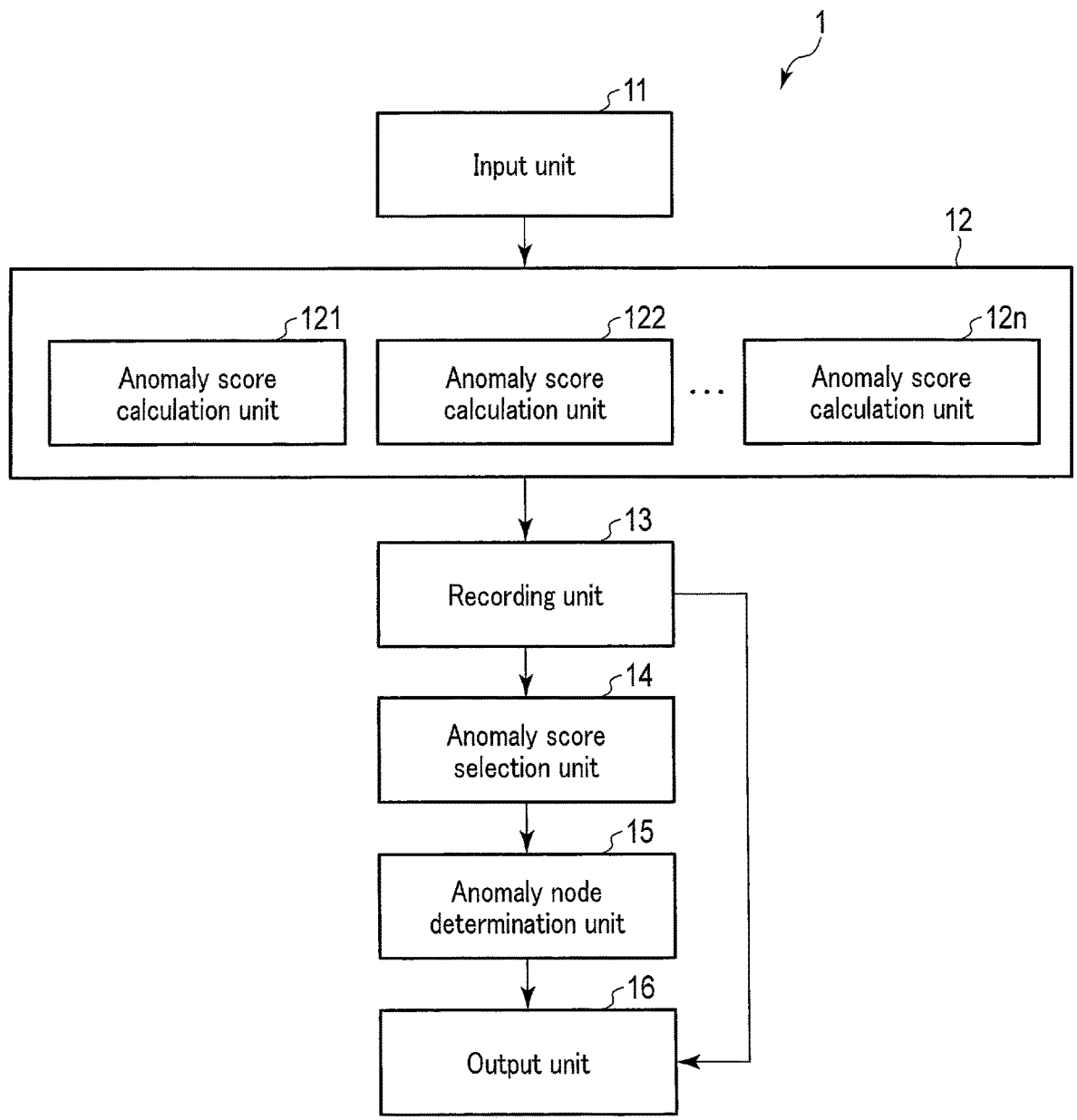
FIG. 5 is a block diagram illustrating a configuration of an information processing apparatus according to a second embodiment.

Next, a second embodiment will be described. FIG. 5 is a block diagram illustrating a configuration of an information processing apparatus according to the second embodiment. Similarly to the first embodiment, the information processing apparatus 1 according to the second embodiment includes an input unit 11, an anomaly score calculation unit 12, a recording unit 13, an anomaly score selection unit 14, an anomaly node determination unit 15, and an output unit 16. However, in the second embodiment, information of extraction ranges of neighboring nodes recorded in the recording unit 13 is also input to the output unit 16. Note that the configuration illustrated in FIG. 3 can be applied as the hardware configuration of the information processing apparatus 1.

Figure 6:
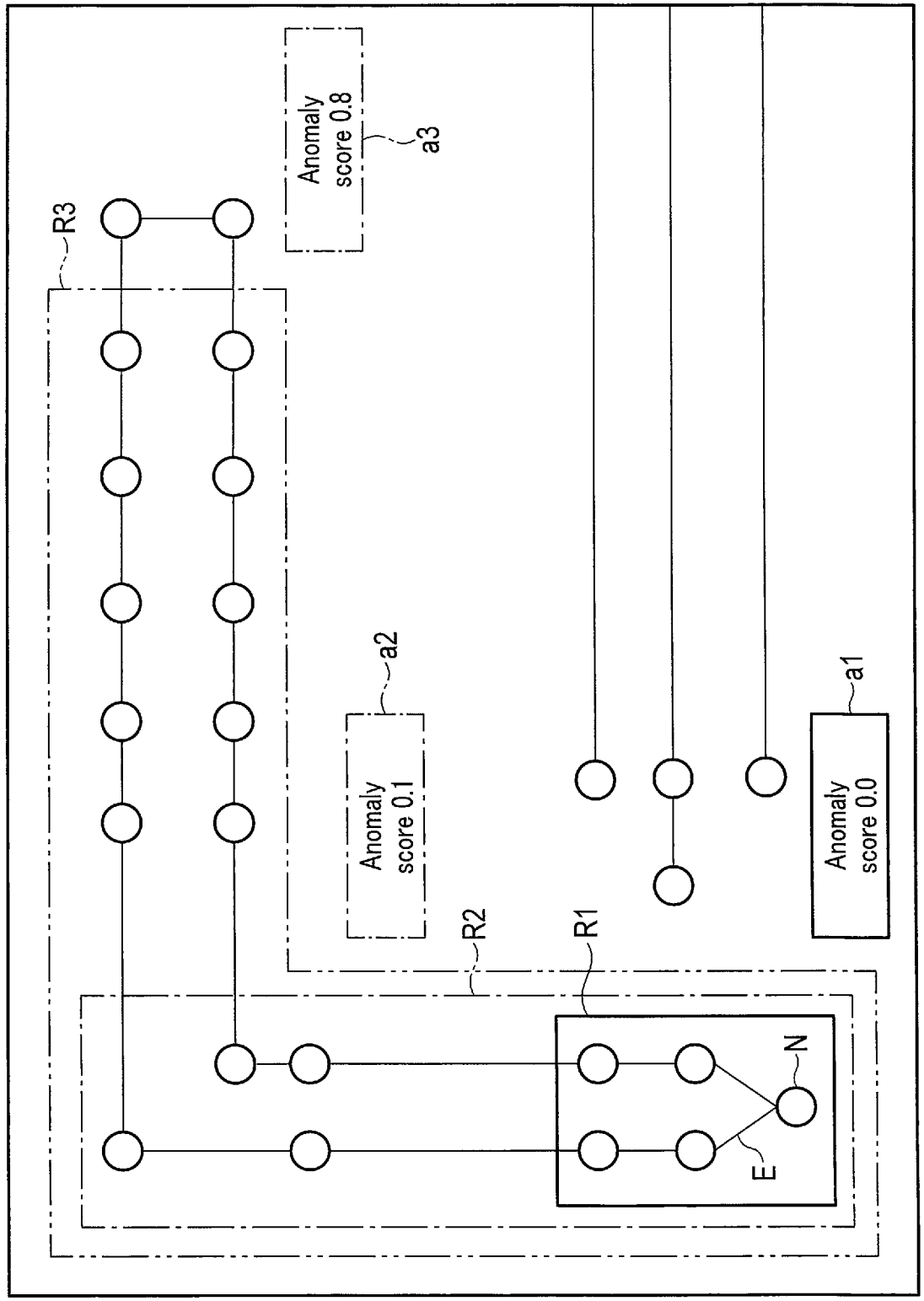
FIG. 6 is a diagram illustrating an example of output in the second embodiment.

The output unit 16 according to the second embodiment associates each anomaly score recorded in the recording unit 13 with information of the extraction ranges of the neighboring nodes, and outputs the anomaly scores and the extraction ranges as information of an anomaly node. FIG. 6 is a diagram illustrating an example of output in the second embodiment. In addition, the output illustrated in FIG. 6 is performed in step S6 illustrated in FIG. 4. Here, in FIG. 6, the output is performed by displaying on a screen of a display device.

In FIG. 6, a graph structure including nodes N and edges E is displayed. Information of an anomaly node may be displayed in this graph structure. FIG. 6 illustrates an example of an output when anomaly scores are calculated by three anomaly score calculation units including GCNs of different numbers of layers. Therefore, the recording unit 13 records information of anomaly scores calculated by each of the three anomaly score calculation units including the GCNs having the different numbers of layers and the extraction ranges of the neighboring nodes extracted by each of the anomaly score calculation units. The output unit 16 according to the second embodiment displays enclosing lines R1, R2, and R3 representing extraction ranges of neighboring nodes in the graph structure in an overlapping manner. Here, the enclosing line R1 represents the extraction range of the anomaly score calculation unit including the GCN having the first number of layers. Similarly, the enclosing line R2 represents the extraction range of the anomaly score calculation unit including the GCN having the second number of layers, and the enclosing line R3 represents the extraction range of the anomaly score calculation unit including the GCN having the third number of layers. For example, the types of the enclosing lines R1, R2, and R3 may be different so that the user can identify the enclosing lines R1, R2, and R3. Further, the output unit 16 displays anomaly scores a1, a2, and a3 corresponding to the vicinities of the enclosing lines R1, R2, and R3, respectively. The anomaly scores a1, a2, and a3 can be, for example, the maximum anomaly scores in the respective extraction ranges. Here, for example, the types of lines of frames enclosing the anomaly scores a1, a2, and a3 may be different so that the user can identify the anomaly scores a1, a2, and a3.

As described above, according to the second embodiment, the user can visually compare the anomaly scores calculated by the respective anomaly score calculation units and the extraction ranges of the corresponding neighboring nodes. As a result, the user can estimate not only an anomaly node but also the cause of the anomaly. For example, in FIG. 6, while the anomaly score a1 in the extraction range indicated by the enclosing line R1 is a low value, the anomaly score a3 in the extraction range indicated by the enclosing line R3 including the enclosing line R1 and the enclosing line R2 is a high value. From this, the user can estimate that the anomaly occurs due to a combination of the nodes enclosed by the enclosing lines R1, R2, and R3.

Here, the extraction ranges and the anomaly scores are not limited to being displayed in the enclosing lines. For example, the extraction ranges may be color-coded like a heat map. For example, color-coded display may be performed, such as green for a low anomaly score, yellow for a medium anomaly score, and red for a high anomaly score. In addition, the extraction range including the maximum anomaly score may be displayed in various modes such as a mode in which the extraction range is highlighted as compared with other extraction ranges.

Furthermore, a user interface (UI) may be provided in which the user selects two or more extraction ranges on the screen illustrated in FIG. 6 and anomaly scores are recalculated in an extraction range including all of the selected extraction rages or an extraction range including at least one of the selected extraction ranges.

Third Embodiment

Next, a third embodiment will be described. In the first embodiment described above, information of the maximum anomaly score and an extraction range of a neighboring node corresponding to the maximum anomaly score is selected, and an anomaly node is determined based on the anomaly score of the node in the selected extraction range. On the other hand, the anomaly node may be determined based on various statistical values using anomaly scores calculated by each of the plurality of anomaly score calculation units.

Figure 7:
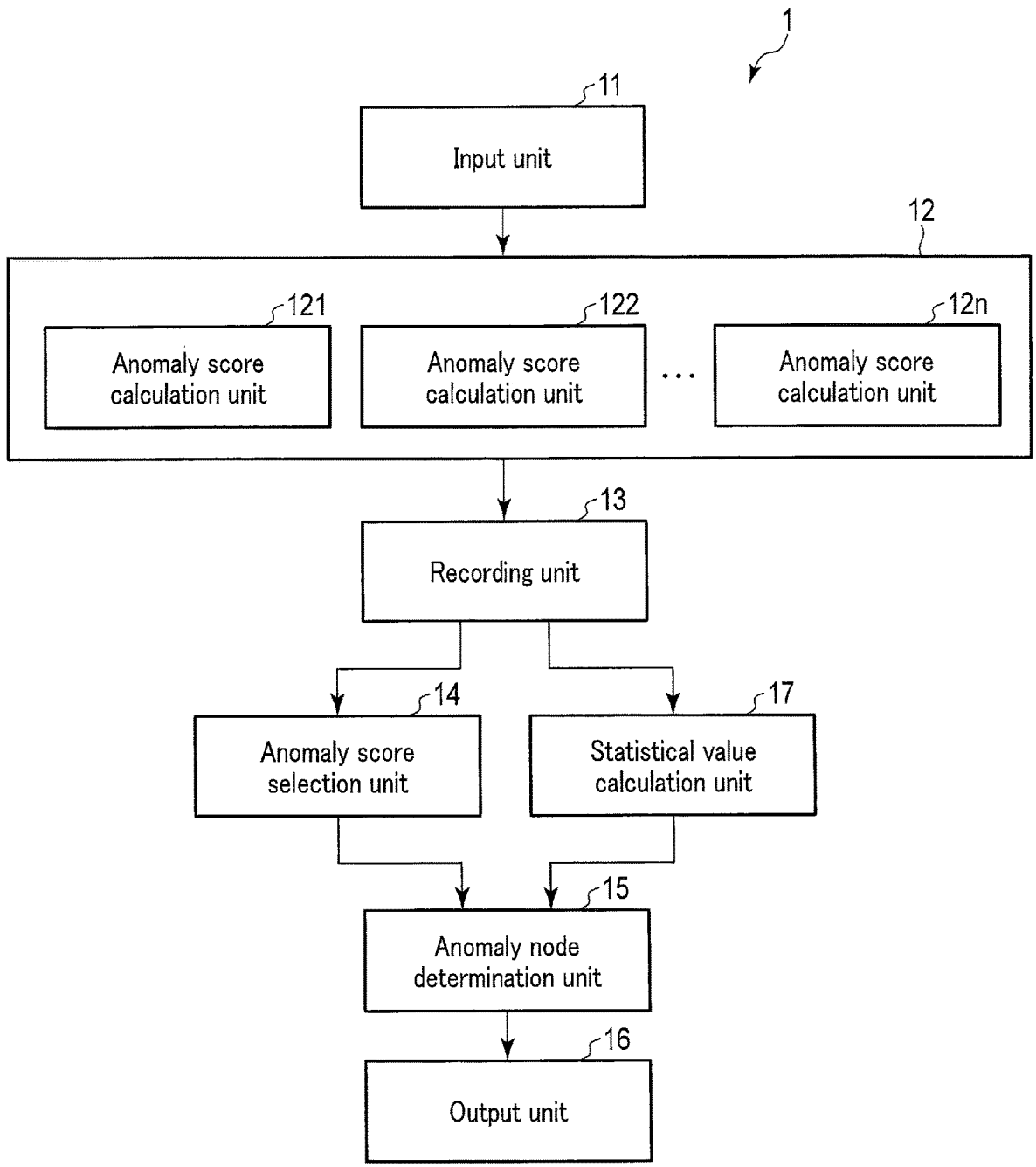
FIG. 7 is a block diagram illustrating a configuration of an information processing apparatus according to a third embodiment.

FIG. 7 is a block diagram illustrating a configuration of an information processing apparatus according to the third embodiment. Similarly to the first embodiment, the information processing apparatus 1 according to the third embodiment includes an input unit 11, an anomaly score calculation unit 12, a recording unit 13, an anomaly score selection unit 14, an anomaly node determination unit 15, and an output unit 16. The information processing apparatus 1 according to the third embodiment further includes a statistical value calculation unit 17. The statistical value calculation unit 17 calculates a statistical value of anomaly scores recorded in the recording unit 13. Here, the statistical value is, for example, a value such as a product, a weighted sum, an average value, or a median value of the anomaly scores. The statistical value may be calculated from the anomaly scores in all extraction ranges, or may be calculated only from anomaly scores in two or more extraction ranges selected by the user in the second embodiment. The statistical value calculation unit 17 can be implemented by a processor 101 included in the information processing apparatus 1 according to the third embodiment. In addition, FIG. 7 illustrates a configuration in which the statistical value calculation unit 17 is added to the configuration illustrated in FIG. 1. On the other hand, the statistical value calculation unit 17 may be added to the configuration illustrated in FIG. 5.

FIG. 8 is a flowchart illustrating an information processing method by the information processing apparatus 1 according to the third embodiment. A process illustrated in FIG. 8 is performed by the processor 101. Here, the same processing as that illustrated in FIG. 4 is denoted by the same reference numerals as those illustrated in FIG. 4, and the description thereof will be omitted. In FIG. 8, after the anomaly score is selected in step S4, the processing in steps S11 and S12 is performed.

In step S11, the processor 101 calculates a statistical value of anomaly scores recorded in a storage 106 included in the information processing apparatus 1 according to the third embodiment. Here, the statistical value is, for example, a value such as a product, a weighted sum, an average value, or a median value of the anomaly scores. The statistical value may be calculated from the anomaly scores in all the extraction ranges, or may be calculated only from anomaly scores in two or more extraction ranges selected by the user in the second embodiment.

In step S12, the processor 101 determines an anomaly node based on the anomaly score selected in step S4 and the statistical value of the anomaly scores calculated in step S11. The anomaly node is, for example, a node in which the statistical value such as the average value is equal to or greater than a threshold and which has an anomaly score equal to or greater than a threshold in the selected extraction range.

As described above, according to the third embodiment, the anomaly node can be determined in consideration of not only the anomaly score of the extraction range but also the anomaly scores of all the extraction ranges.

Modifications

Hereinafter, modifications of the embodiments will be described. In the above-described embodiments, representations of nodes with peripheral structures in different extraction ranges are extracted using, for example, GCNs. The representations may be extracted using various methods other than the GCNs, such as GAT (Graph Attention Network), GIN (Graph Isomorphism Network), and GraphSAGE.

In the embodiments described above, the anomaly scores are calculated using Generalized ODIN. However, the anomaly scores may be calculated using various methods such as Mahalanobis. By using Mahalanobis instead of Generalized ODIN, separation with richer information than a posterior distribution is expected.

In addition, in the above-described embodiments, as the data of the graph structure, the graphed data of the chemical molecule structure, the graphed data of the citation relationship of the paper, the graphed data of the co-selling relationship of the product, the graphed data of the relationship of the user in the social network, the graphed data of the design drawing of the electric circuit, the graphed data of the source code of the program, and the plurality of pieces of graphed sensor data are exemplified. In the embodiments, data having any graph structure may be used. On the other hand, the technology of the embodiments is particularly suitable for data in which the order or combination of nodes is important and anomaly of a node needs to be detected, such as data of a design drawing, data of a source code of a program, and sensor data.

The instructions indicated in the processing procedures described in the above-described embodiments can be executed based on a program that is software. By storing this program in advance and reading this program, a general-purpose computer system can obtain effects similar to the effects of the information processing apparatuses described above. The instructions described in the above-described embodiments are recorded in a magnetic disk (flexible disk, hard disk, or the like), an optical disc (CD-ROM, CD-R, CD-RW, DVD-ROM, DVD±R, DVD±RW, Blu-ray (registered trademark) disc, or the like), a semiconductor memory, or a recording medium similar thereto as the program that can be executed by a computer. The storage format may be any form as long as the recording medium is readable by a computer or an embedded system. When the computer reads the program from the recording medium and causes a CPU to execute the instructions described in the program based on the program, the same operation as that of the information processing apparatuses according to the above-described embodiments can be implemented. Of course, in a case where the computer acquires or reads the program, the computer may acquire or read the program via a network.

In addition, an operating system (OS) running on the computer, middleware (MW) such as database management software, a network, or the like may execute a part of each of the processes for implementing the present embodiment based on an instruction of the program installed in the computer or the embedded system from the recording medium.

Furthermore, the recording medium in the present embodiment is not limited to the medium independent of the computer or the embedded system, and includes a recording medium that downloads and stores or temporarily stores the program transmitted via a LAN, the Internet, or the like.

Furthermore, the number of recording media is not limited to one. Also in a case where the processing in the present embodiment is executed from a plurality of media, the media may be included in the recording medium in the present embodiment, and each of the configurations of the media may be any configuration.

Note that the computer or the embedded system in the present embodiment is for executing each of the processes in the present embodiment based on the program stored in the recording medium, and may have any configuration such as an apparatus including one of a personal computer, a microcomputer, and the like, a system in which a plurality of apparatuses are connected to a network, or the like.

In addition, the computer in the present embodiment is not limited to a personal computer, and includes an arithmetic processing apparatus, a microcomputer, and the like included in an information processing apparatus, and collectively refers to a device and an apparatus that are capable of implementing the functions in the present embodiment by the program.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An information processing apparatus comprising a processor including hardware configured to:
   extract neighboring nodes in two or more different extraction ranges for each node constituting input data of a graph structure;
   calculate an anomaly score representing a degree of anomaly of the node for each extraction range based on a representation of a combination of the node and the neighboring nodes;
   record each calculated anomaly score in a storage;
   select a maximum anomaly score among the anomaly scores recorded in the storage;
   determine an anomaly node in the input data of the graph structure based on the selected maximum anomaly score; and
   output information of the anomaly node.

2. The information processing apparatus according to claim 1, wherein the processor records the anomaly scores in the storage in association with the extraction ranges, and
   the anomaly scores and the extraction ranges recorded in the storage are output as information of the anomaly node.

3. The information processing apparatus according to claim 1, wherein
   the processor calculates at least any of a product, a weighted sum, an average value, and a median value of the anomaly scores recorded in the storage, and
   the anomaly node is determined based on the selected maximum anomaly score and at least any of the product, the weighted sum, the average value, and the median value.

4. The information processing apparatus according to claim 1, wherein the input data of the graph structure includes at least any of graphed data of a chemical molecular structure, graphed data of a citation relationship of a paper, graphed data of a co-selling relationship of a product, data of a relationship of a user in a social network, graphed data of a design drawing of an electric circuit, graphed data of a source code of a program, and a plurality of pieces of graphed sensor data.

5. The information processing apparatus according to claim 1, wherein the processor calculates the anomaly scores by Generalized ODIN or Mahalanobis.

6. An information processing method comprising:
   extracting neighboring nodes in two or more different extraction ranges for each node constituting input data of a graph structure;
   calculating an anomaly score representing a degree of anomaly of the node for each extraction range based on a representation of a combination of the node and the neighboring nodes;
   selecting a maximum anomaly score among the anomaly scores recorded in the storage;
   determining an anomaly node in the input data of the graph structure based on the selected maximum anomaly score; and
   outputting information of the anomaly node.

7. A computer-readable non-transitory recording medium storing an information processing program for causing a computer to execute:
   extracting neighboring nodes in two or more different extraction ranges for each node constituting input data of a graph structure;
   calculating an anomaly score representing a degree of anomaly of the node for each extraction range based on a representation of a combination of the node and the neighboring nodes;
   selecting a maximum anomaly score among the anomaly scores recorded in the storage;
   determining an anomaly node in the input data of the graph structure based on the selected maximum anomaly score; and
   outputting information of the anomaly node.

* * * * *